(12) United States Patent
Woo et al.

(10) Patent No.: US 12,567,865 B2
(45) Date of Patent: Mar. 3, 2026

(54) SEMICONDUCTOR DEVICE

(71) Applicant: SAMSUNG ELECTRONICS CO., LTD., Suwon-si (KR)

(72) Inventors: Jejoong Woo, Suwon-si (KR); Jaewoo Park, Suwon-si (KR); Seungyeob Baek, Suwon-si (KR); Myoungbo Kwak, Suwon-si (KR); Junghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 110 days.

(21) Appl. No.: 18/667,343

(22) Filed: May 17, 2024

(65) Prior Publication Data

US 2025/0125812 A1 Apr. 17, 2025

(30) Foreign Application Priority Data

Oct. 11, 2023 (KR) ........................ 10-2023-0134930

(51) Int. Cl.
| | |
|---|---|
| *H03M 1/00* | (2006.01) |
| *H03L 7/087* | (2006.01) |
| *H03M 1/12* | (2006.01) |
| *H03M 1/46* | (2006.01) |
| *H04L 25/49* | (2006.01) |

(52) U.S. Cl.
CPC ............ *H03M 1/002* (2013.01); *H03L 7/087* (2013.01); *H03M 1/1215* (2013.01); *H03M 1/1245* (2013.01); *H03M 1/1255* (2013.01); *H03M 1/46* (2013.01); *H04L 25/4917* (2013.01)

(58) Field of Classification Search
CPC .. H03M 1/002; H03M 1/1255; H03M 1/1215; H03M 1/1245; H03M 1/46; H03L 7/087; H04L 25/4917
See application file for complete search history.

(56) References Cited

U.S. PATENT DOCUMENTS

| | | | |
|---|---|---|---|
| 7,492,849 B2 | 2/2009 | On et al. | |
| 9,209,966 B1 | 12/2015 | Hossain et al. | |
| 10,644,706 B1 | 5/2020 | Kim et al. | |
| 11,477,004 B1 | 10/2022 | Aziz et al. | |
| 11,658,696 B2 * | 5/2023 | Pandita ............... H04L 25/4917 375/219 |
| 2002/0080898 A1 | 6/2002 | Agazzi et al. | |
| 2009/0224806 A1 | 9/2009 | Huang et al. | |
| 2023/0291412 A1 * | 9/2023 | Roh ...................... H03M 1/186 |

FOREIGN PATENT DOCUMENTS

| | | |
|---|---|---|
| CN | 112332838 | 2/2021 |
| KR | 10-2014-0093902 | 7/2014 |

* cited by examiner

*Primary Examiner* — Khai M Nguyen
(74) *Attorney, Agent, or Firm* — Fish & Richardson P.C.

(57) ABSTRACT

An example semiconductor device includes a plurality of analog-to-digital converters (ADCs) configured to receive an analog signal from at least one amplifier connected to a pad, and a logic circuit configured to control the plurality of ADCs. The logic circuit is configured to activate first active ADCs, among the plurality of ADCs, in a first operating mode, and to activate second active ADCs, among the plurality of ADCs, in a second operating mode different from the first operating mode. A first latency required for the first active ADCs to receive the analog signal and to output a first digital signal is longer than a second latency required for the second active ADCs to receive the analog signal and to output a second digital signal.

20 Claims, 16 Drawing Sheets

SEMICONDUCTOR DEVICE

CROSS-REFERENCE TO RELATED APPLICATION

This application claims benefit of priority to Korean Patent Application No. 10-2023-0134930 filed on Oct. 11, 2023, in the Korean Intellectual Property Office, the disclosure of which is incorporated herein by reference in its entirety.

BACKGROUND

A semiconductor device may exchange a signal with another other external semiconductor device, and may perform data communication with the other semiconductor device via the signal. A semiconductor device may include a driver, transmitting signals to another external semiconductor device, and a receiver, receiving a signal from the other semiconductor device. The receiver may receive analog signals, convert the analog signals into digital signals, and transmit the digital signals to an internal digital processing circuit. Recently, various receivers, implemented based on analog-to-digital converters (ADCs), have been proposed to improve the performance of semiconductor devices and reduce power consumption.

SUMMARY

The present disclosure relates to semiconductor devices, including a semiconductor device capable of securing optimal performance while lowering power consumed by a receiver by controlling the receiver based on an analog-to-digital converter (ADC) differently, depending on an operating mode.

In general, according to some aspects, a semiconductor device includes an amplifier connected to a pad, the amplifier configured to receive an analog signal, a plurality of ADCs connected to an output terminal of the amplifier in parallel, an equalizer connected to output terminals of the plurality of ADCs, a first phase detector connected to an output terminal of the equalizer, a second phase detector connected to the output terminals of the plurality of ADCs, and a clock generator configured to output a clock signal to each of the plurality of ADCs with reference to an output of the first phase detector or an output of the second phase detector. The equalizer may be activated in a first operating mode, and is deactivated in a second operating mode, different from the first operating mode. The clock generator may be configured to output the clock signal with reference to the output of the first phase detector in the first operating mode, and to output the clock signal with reference to the output of the second phase detector in the second operating mode.

In general, according to some aspects, a semiconductor device includes a plurality of ADCs connected to each other in parallel, the plurality of ADCs configured to receive one analog signal, a clock generator configured to provide clock signals having different phases to the plurality of ADCs, respectively, and a logic circuit configured to control the plurality of ADCs. Each of the plurality of ADCs may include a capacitor digital-to-analog converter (CDAC) including a plurality of capacitors and a plurality of switches, and a comparator configured to receive an output of the CDAC and to output digital data. A first number of first active ADCs, among the plurality of ADCs, may be activated when a first operating mode is selected, and a second number of active ADCs, less than the first number of first active ADCs, may be activated when a second operating mode, different from the first operating mode, is selected. The logic circuit may be configured to control the CDAC and the comparator in each of the first active ADCs to perform a successive approximation operation, and to perform an offset cancellation operation on the CDAC in each of the second active ADCs.

In general, according to some aspects, a semiconductor device includes a plurality of ADCs configured to receive an analog signal from at least one amplifier connected to a pad, and a logic circuit configured to control the plurality of ADCs. The logic circuit may be configured to activate first active ADCs, among the plurality of ADCs, in a first operating mode, and to activate second active ADCs, among the plurality of ADCs, in a second operating mode different from the first operating mode. A first latency required for the first active ADCs to receive the analog signal and output a digital signal may be longer than a second latency required for the second active ADCs to receive the analog signal and output a digital signal.

BRIEF DESCRIPTION OF THE DRAWINGS

The above and other aspects, features, and advantages of the present disclosure will be more clearly understood from the following detailed description, taken in conjunction with the accompanying drawings.

DETAILED DESCRIPTION

Hereinafter, example implementations of the present disclosure will be described with reference to the attached drawings.

Figure 1:
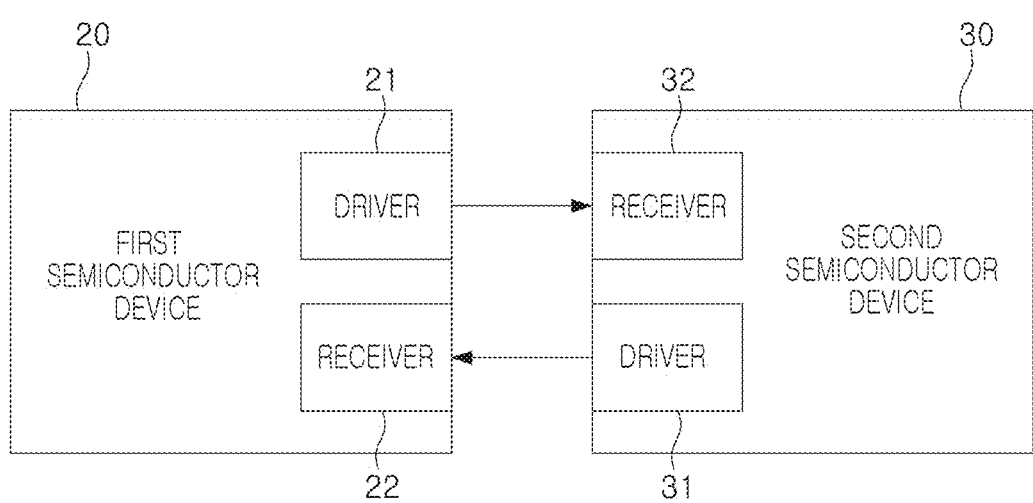
FIG. 1 is a schematic block diagram illustrating an example of a system including a semiconductor device.

FIG. 1 is a schematic block diagram illustrating an example of a system including a semiconductor device.

Referring to FIG. 1, a system 10 includes a first semiconductor device 20 and a second semiconductor device 30, exchanging a signal with each other. The first semiconductor device 20 and the second semiconductor device 30 may include drivers 21 and 31 outputting a signal and receivers 22 and 32 receiving a signal, respectively.

For example, in the system 10 illustrated in FIG. 1, the first semiconductor device 20 may be a host device such as an application processor, a central processing unit, or a system-on-chip, and the second semiconductor device 30 may be a memory device storing data. In this case, the driver 21 of the first semiconductor device 20 may output a data signal including data to be stored in the second semiconductor device 30, and a control signal and a clock signal necessary for an operation of the second semiconductor device 30. The second semiconductor device 30 may read data stored internally based on the control signal and the clock signal, and the data signal including data may be output to the first semiconductor device 20 by the driver 31.

A signal, transmitted between the first semiconductor device 20 and the second semiconductor device 30, may be a signal transitioning between two or more levels. A level of the signal may be determined by operations of a pull-up circuit and a pull-down circuit included in the drivers 21 and 31. For example, the pull-up circuit may be a circuit connected between an output node outputting a signal and a first power node supplying a first power voltage, and the pull-down circuit may be a circuit connected between a second power node supplying a second power voltage, lower than the first power voltage, and the output node. Each of the first semiconductor device 20 and the second semiconductor device 30 may internally generate a control code for controlling the pull-up circuit and the pull-down circuit, and a level of a signal, output by the drivers 21 and 31, may be determined by the control code.

For example, the signal transmitted between the first semiconductor device 20 and the second semiconductor device 30 may be a non-returning zero (NRZ) signal transitioning between a first reference level and a second reference level. Alternatively, in some implementations, the signal transmitted between the first semiconductor device 20 and the second semiconductor device 30 may be a multilevel signal transitioning between three or more reference levels. The signal transmitted between the first semiconductor device 20 and the second semiconductor device 30 may be an analog signal.

The receivers 22 and 32 may include an amplifier processing an analog signal, an analog-to-digital converter (ADC) converting an analog signal into a digital signal, and a phase detector adjusting a phase of a clock signal input to the ADC. The receivers 22 and 32 may output the digital signal to a digital processing circuit included in the first semiconductor device 20 or the second semiconductor device 30.

A signal transmission speed between the first semiconductor device 20 and the second semiconductor device 30 may increase, and accordingly a plurality of ADCs may be included in the receivers 22 and 32. The plurality of ADCs may be connected to each other in parallel, and may operate in synchronization with clock signals having different phases. Thus, the receivers 22 and 32 may be implemented with the plurality of ADCs, thereby improving performance of the receivers 22 and 32.

However, when all of the plurality of ADCs included in the receivers 22 and 32 operate, the receivers 22 and 32 may have increased power consumption. In some implementations, the number of ADCs actually activated in the receivers 22 and 32 to convert an analog signal into a digital signal may vary depending on an operating mode of each of the semiconductor devices 20 and 30, thereby improving performance of the receivers 22 and 32 while optimally controlling power consumption of the receivers 22 and 32.

For example, when a multilevel signal or a high-frequency signal is received from the first semiconductor device 20, the receiver 32 of the second semiconductor device 30 may activate a relatively large number of ADCs to receive the signal. Conversely, when an NRZ signal or a low-frequency signal is received from the first semiconductor device 20, a relatively small number of ADCs may be activated to receive the signal. In some implementations, depending on the number of ADCs being activated, the phase detector, operating in the receiver 32, may also vary.

Figure 2:
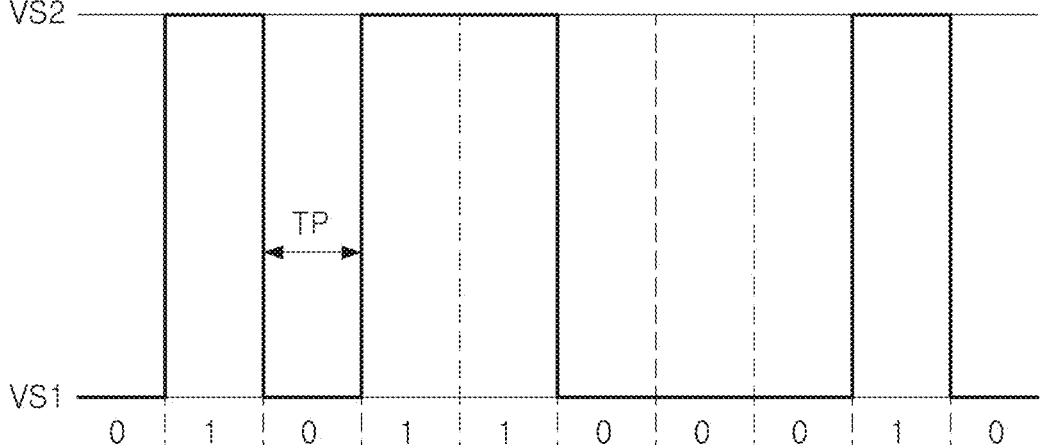
FIGS. 2 and 3 are diagrams illustrating an example of an operation of a semiconductor device.
Figure 3:
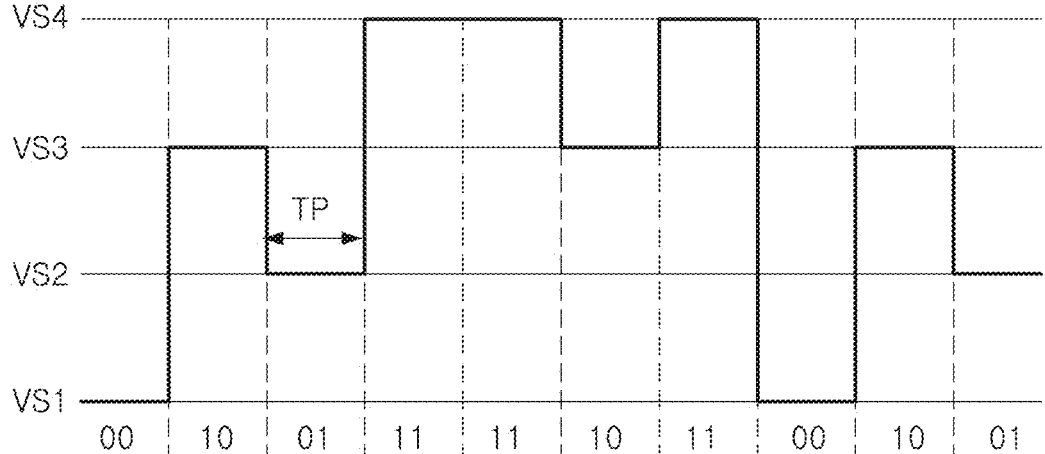

FIGS. 2 and 3 are diagrams illustrating an example of an operation of a semiconductor device.

FIGS. 2 and 3 may be example waveform diagrams illustrating analog signals received from another external semiconductor device by a receiver of a semiconductor device. In FIG. 2, the receiver of the semiconductor device may receive an NRZ signal transitioning between a first reference level VS1 and a second reference level VS2. 1-bit data may be transmitted per period (TP) by the NRZ signal.

The receiver of the semiconductor device may receive a multilevel signal. In FIG. 3, the multilevel signal received by the receiver may be a pulse amplitude modulation (PAM)-4 signal transitioning between first to fourth reference levels VS1 to VS4. When the multilevel signal is used, more pieces of data may be rapidly transmitted with a signal having the same frequency, as compared to the NRZ signal.

Each of the first to fourth reference levels VS1 to VS4 may match 2-bit data, and thus 2-bit data may be transmitted per period (TP) by the multilevel signal. Referring to FIG. 3, the first reference level VS1 may match [00], the second reference level VS2 may match [01], the third reference level VS3 may match [10], and the fourth reference level VS4 may match [11]. However, in some implementations, a matching relationship between the first to fourth reference levels VS1 to VS4 and 2-bit data may be modified in various manners. In the multilevel signal, the number of bits of data that may be transmitted per period (TP) may vary depending on the number of the reference levels VS1 to VS4.

In some implementations, the receiver of the semiconductor device may receive the multilevel signal or NRZ signal as an analog signal from another external semiconductor device. In some implementations, the receiver may receive the multilevel signal in a first operating mode, and may receive the NRZ signal in a second operating mode. The receiver may include ADCs converting an analog signal into a digital signal, and the ADCs may operate in synchronization with clock signals having different phases. In addition, operations of the ADCs included in the receiver may be controlled differently depending on an operating mode.

For example, the number of ADCs activated in the first operating mode may be greater than the number of ADCs activated in the second operating mode. For example, in the first operating mode, digital signals, output by the ADCs, may be processed by an equalizer and then input to a digital processing circuit. In the second operation code, digital signals, output by the ADCs, may be input to the digital processing circuit without any processing operation performed by the equalizer. In an example, a first phase detector, detecting a phase from output signals of the ADCs in the first operating mode, may operate in a manner different from that of a second phase detector, detecting a phase from output signals of the ADCs in the second operating mode. As such, in some implementations, the receiver may be controlled differently depending on the operating mode, thereby optimally managing performance and power consumption of the receiver.

Figure 4:
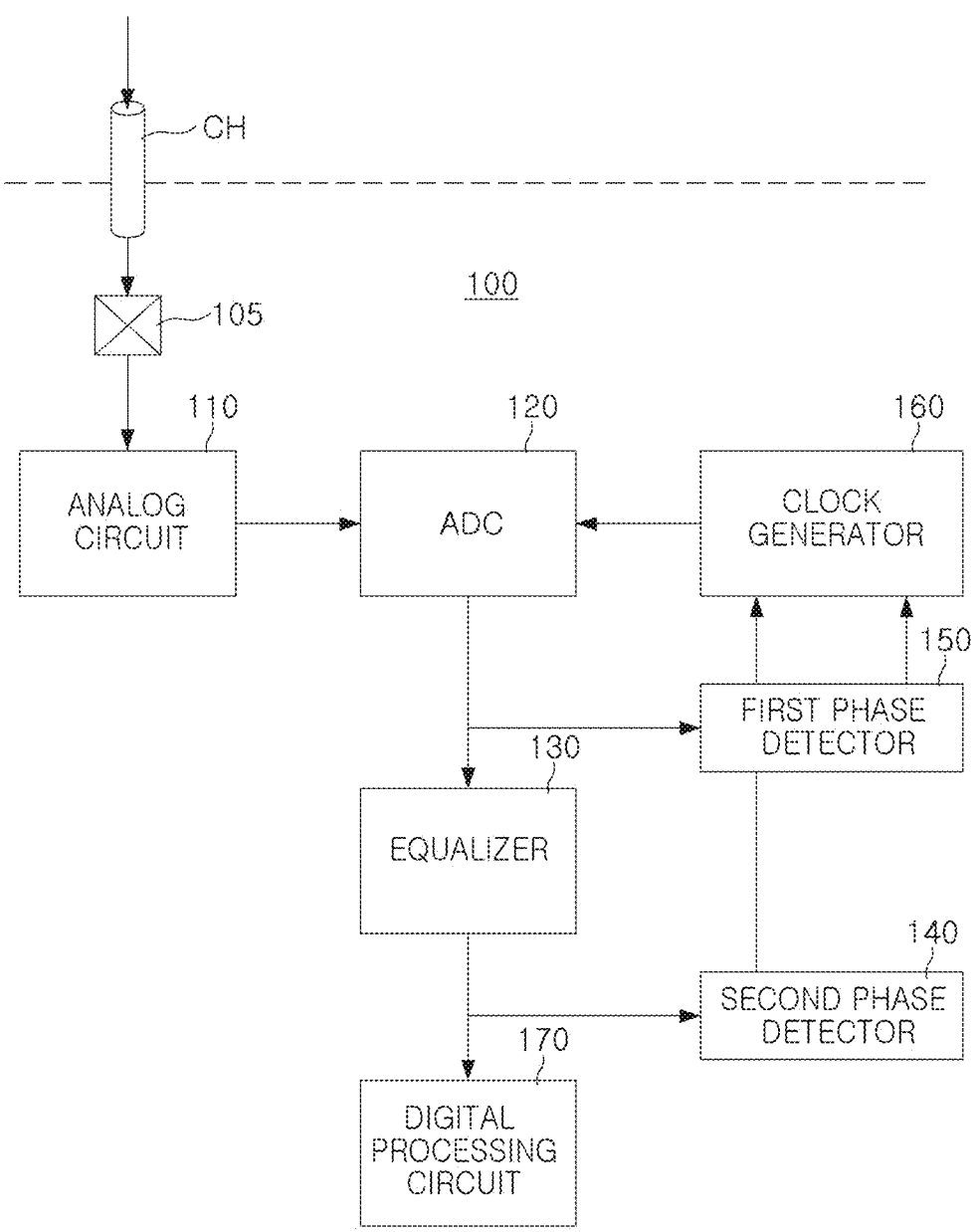
FIG. 4 is a schematic diagram illustrating an example of a semiconductor device.

FIG. 4 is a schematic diagram illustrating an example of a semiconductor device.

Referring to FIG. 4, a semiconductor device 100 includes a pad 105 connected to another external semiconductor device through a channel CH, an analog circuit 110, an ADC 120, an equalizer 130, a first phase detector 140, a second phase detector 150, a clock generator 160, and a digital processing circuit 170. The analog circuit 110, the ADC 120, the equalizer 130, the first phase detector 140, the second phase detector 150, and the clock generator 160 may provide a receiver, converting an analog signal, received by the pad 105, into a digital signal and outputting the digital signal to the digital processing circuit 170.

The analog circuit 110 may include at least one amplifier. The analog circuit 110 may amplify an analog signal received by the pad 105, and may filter a specific frequency band from the analog signal.

The ADC 120 may convert, an analog signal output by the analog circuit 110, into a digital signal. For example, the ADC 120 may include a plurality of ADCs, and the plurality of ADCs may be connected to each other in parallel. Accordingly, the analog signal, output by the analog circuit 110, may be input to the plurality of ADCs in common.

The equalizer 130 may be implemented as a decision feedback equalizer (DFE) or a feed forward equalizer (FFE). The equalizer 130 may improve an eye margin of a signal by reducing interference between adjacent symbols. In some implementations, the equalizer 130 may not operate depending on characteristics of the analog signal received by the pad 105.

The first phase detector 140 may be a Mueller-Muller phase detector (MMPD), and the second phase detector 150 may be a bang-bang phase detector (BBPD). The first phase detector 140 may detect a phase error using a digital signal output by the equalizer 130, and the second phase detector 150 may detect a phase error using a digital signal output by the ADC.

The clock generator 160 may adjust a phase of a clock signal input to the ADC 120 using the phase error detected by the first phase detector 140 or the second phase detector 150. The clock generator 160 may include a loop filter, an oscillator, and the like.

The digital processing circuit 170 may restore data received as an analog signal using a digital signal, and may perform various operations using the data. For example, when the semiconductor device 100 is a memory device, the data, received as an analog signal, may be stored in memory cells. Hereinafter, an operation of the receiver according to an operating mode of the semiconductor device 100 will be described in more detail with reference to FIGS. 5 and 6.

Figure 5:
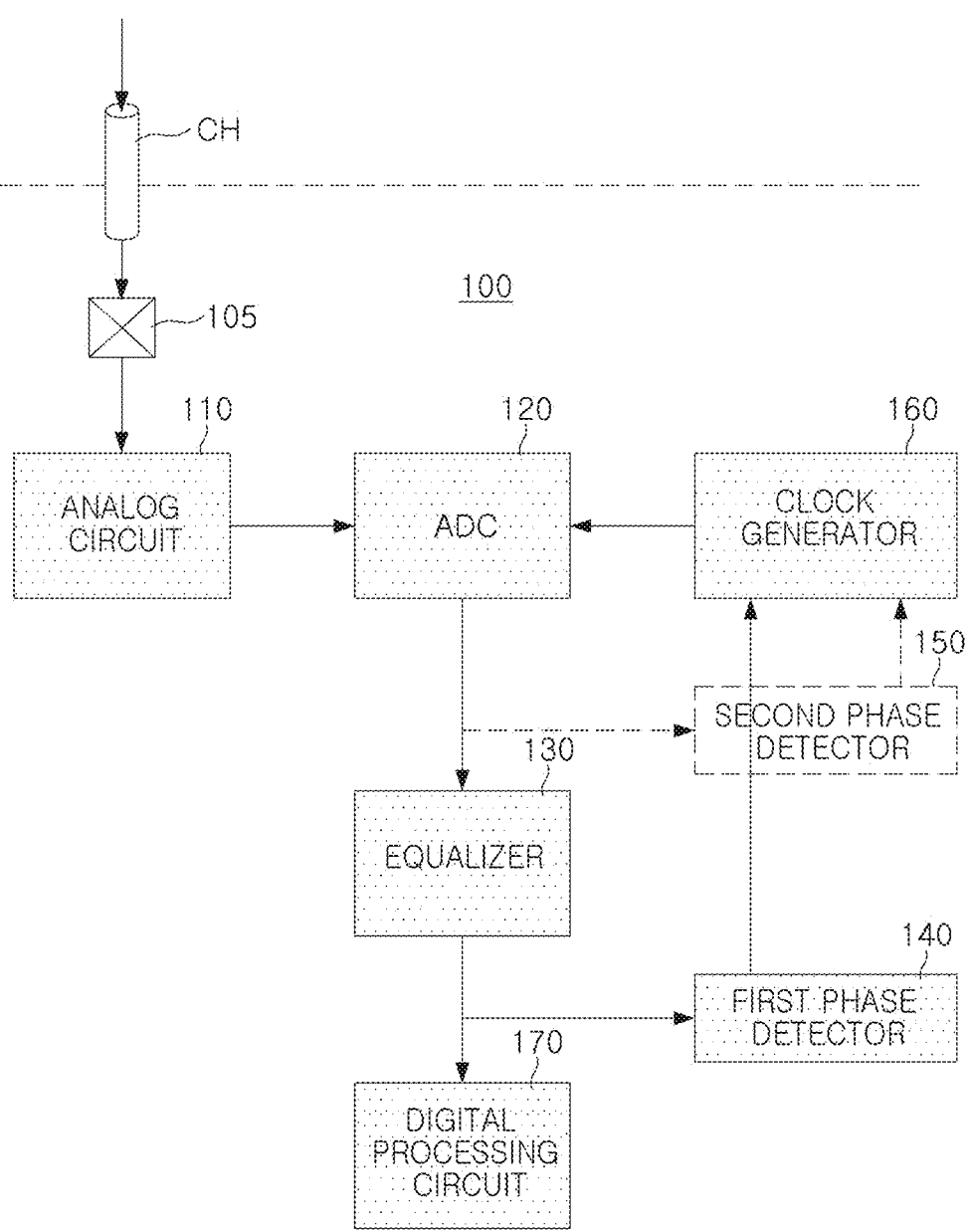
FIGS. 5 and 6 are diagrams illustrating an example of an operation of a semiconductor device.
Figure 6:
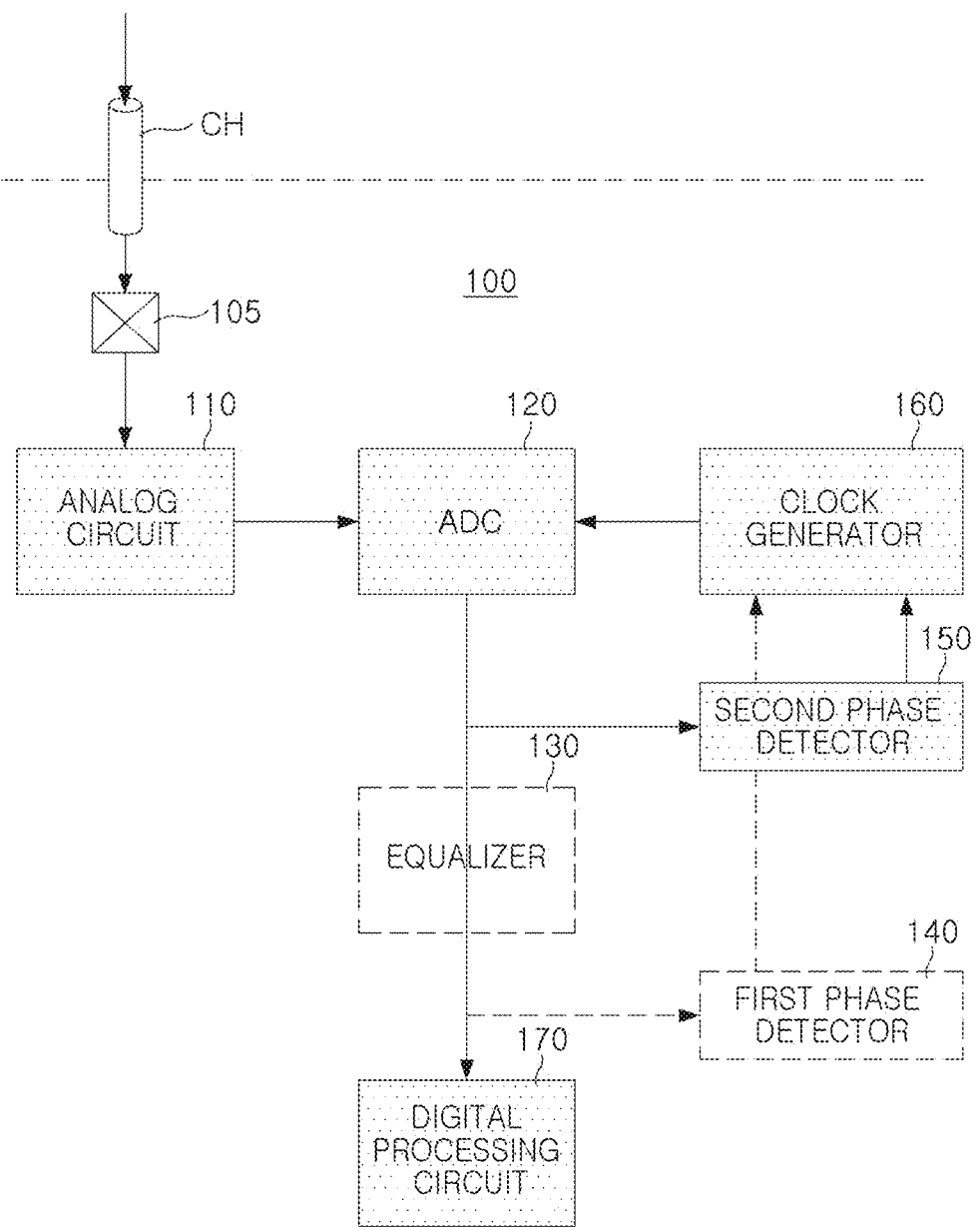

FIGS. 5 and 6 are diagrams illustrating an example of an operation of a semiconductor device.

First, FIG. 5 may be a diagram illustrating a first operating mode. Referring to FIG. 5, in the first operating mode, an analog signal may be converted into a digital signal by an analog circuit 110, an ADC 120, an equalizer 130, a first phase detector 140, and a clock generator 160. In the first operating mode, the second phase detector 150 may be deactivated, and first active ADCs, among a plurality of ADCs included in the ADC 120, may be activated. The first active ADCs may receive an analog signal in common.

The first active ADCs may convert an analog signal into a digital signal in synchronization with clock signals output by the clock generator 160. For example, the clock generator 160 may output a plurality of clock signals having different phases. A clock signal, input to one of the first active ADCs, may have a phase different from those of clock signals, input to the remaining first active ADCs. Accordingly, each of the first active ADCs may sample an analog signal at different timings and convert the analog signal into a digital signal.

Each of the first active ADCs may output N-bit data (N is a natural number of 2 or more) after one sampling.

Outputs of the first active ADCs may be input to the equalizer 130. The equalizer 130 may improve an eye margin of a digital signal by reducing interference between adjacent symbols. An output of the equalizer 130 may be input to the first phase detector 140, and the first phase detector 140 may be a Muller-Muller phase detector. For example, the first phase detector 140 may detect a phase error using a result of comparing a digital signal with a low reference voltage and a high reference voltage.

The clock generator 160 includes a loop filter, an oscillator, and the like, and may determine a phase of each of clock signals, input to the first active ADCs, using the phase error detected by the first phase detector 140. A digital signal, output by the equalizer 130, may be received by a digital processing circuit 170.

FIG. 6 may be a diagram illustrating a second operating mode, different from the first operating mode. For example, the second operating mode may be an operating mode in which a data rate of an analog signal received with a pad 105 is lower than that of the first operating mode, or may be a low-power mode of the semiconductor device 100.

Referring to FIG. 6, in the second operating mode, an analog signal may be converted into a digital signal by an analog circuit 110, an ADC 120, a second phase detector 150, and a clock generator 160. In the second operating mode, the equalizer 130 and the first phase detector 140 may be deactivated, and second active ADCs, among the plurality of ADCs included in the ADC 120, may be activated. The second active ADCs may receive an analog signal in common. For example, the number of the second active ADCs may be less than the number of the first active ADCs activated in the first operating mode.

The second active ADCs may convert an analog signal into a digital signal in synchronization with clock signals output by the clock generator 160. For example, a clock signal, input to one of the second active ADCs, may have a phase different from those of clock signals, input to the remaining second active ADCs.

In some implementations, some second active ADCs, among the second active ADCs, may sample a data signal, and the remaining second active ADCs, among the second active ADCs, may sample an edge of an analog signal. The some second active ADCs, sampling the data signal, may output 1-bit data with one sampling. The second phase detector 150 may detect a phase error with reference to a result of sampling, by the remaining second active ADCs, the edge of the analog signal. In some implementations, the number of the second active ADCs, sampling the data signal, and the number of the second active ADCs, detecting the edge of the analog signal, may be equal to each other.

The clock generator 160 may determine a phase of each of clock signals, input to the first active ADCs, using the phase error detected by the second phase detector 150. In the second operating mode, a digital signal, output by the second active ADCs, may be input to a digital processing circuit 170 without intervention of the equalizer 130.

In some implementations, a smaller number of second active ADCs may be activated and the equalizer 130 may be deactivated in the second operating mode, as compared to the first operating mode, thereby reducing power consumed by a receiver in the second operating mode. A frequency of each of clock signals, input to the second active ADCs in the second operating mode, may be higher than a frequency of each of clock signals, input to the first active ADCs in the first operating mode.

Figure 7:
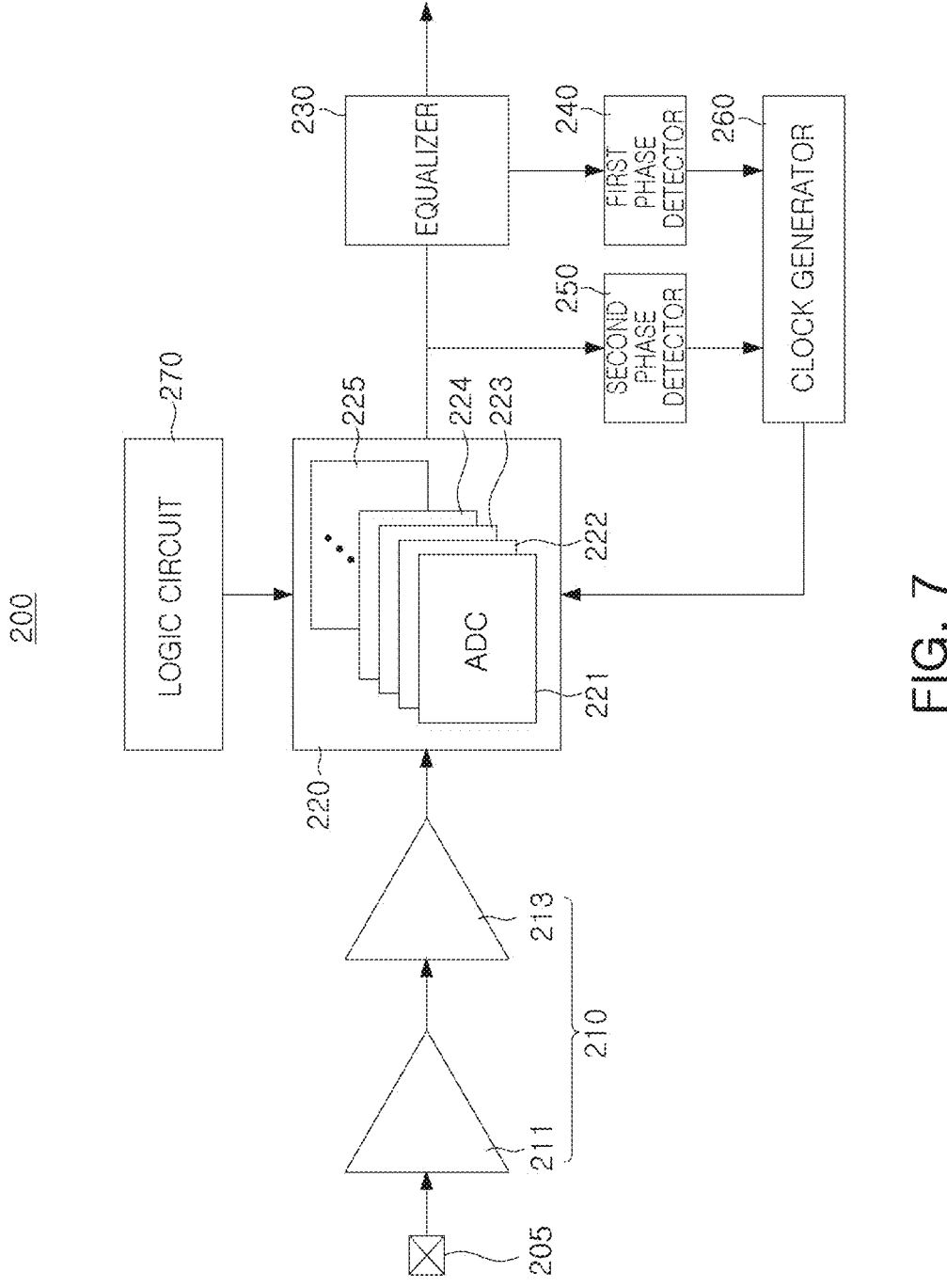
FIG. 7 is a schematic diagram illustrating an example of a semiconductor device.

FIG. 7 is a schematic diagram illustrating an example of a semiconductor device.

Referring to FIG. 7, a semiconductor device 200 includes a pad 205, an analog circuit 210, an ADC 220, an equalizer 230, a first phase detector. 240, a second phase detector 250, a clock generator 260, and a logic circuit 270. The pad 205 may be electrically connected to another external semiconductor device, and may receive an analog signal. The analog signal may be a multilevel signal or NRZ signal.

The analog circuit 210 may include a first amplifier 211 and a second amplifier 213. An input terminal of the first amplifier 211 may be directly connected to the pad 205. For example, the first amplifier 211 may be a continuous time linear equalizer (CTLE), and may perform high-pass filtering on an analog signal received by the pad 205. The second amplifier 213 may be a variable gain amplifier (VGA), and may amplify an analog signal output by the first amplifier 211.

The ADC 220 may include a plurality of ADCs 221 to 225. The plurality of ADCs 221 to 225 may be connected to each other in parallel, and thus an analog signal, output by the second amplifier 213, may be input to active ADCs, activated among the plurality of ADCs 221 to 225, in common.

The equalizer 230 may be implemented as a DFE or FFE, and may reduce interference between adjacent symbols in a digital signal, output by the active ADCs, thereby improving an eye margin of the digital signal.

The first phase detector 240 may detect a phase error of the digital signal, output by the equalizer 230, and may provide the detected phase error to the clock generator 260. The second phase detector 250 may detect a phase error of the digital signal, output by the active ADCs, and may provide the detected phase error to the clock generator 260.

The clock generator 260 may provide clock signals to the active ADCs, reflecting the phase errors. For example, at least some clock signals, among the clock signals output by the clock generator 260, may have different phases.

The logic circuit 270 may select active ADCs converting an analog signal into a digital signal, among the plurality of ADCs 221 to 225, and may control operations thereof. For example, the logic circuit 270 may select active ADCs according to an operating mode of the semiconductor device 200 and/or characteristics of an analog signal input to the pad 205.

Each of the plurality of ADCs 221 to 225 may be implemented as a successive approximation ADC including a capacitor digital-to-analog converter (CDAC) and a comparator. Hereinafter, with reference to FIG. 8, each of the plurality of ADCs 221 to 225 will be described in more detail.

Figure 8:
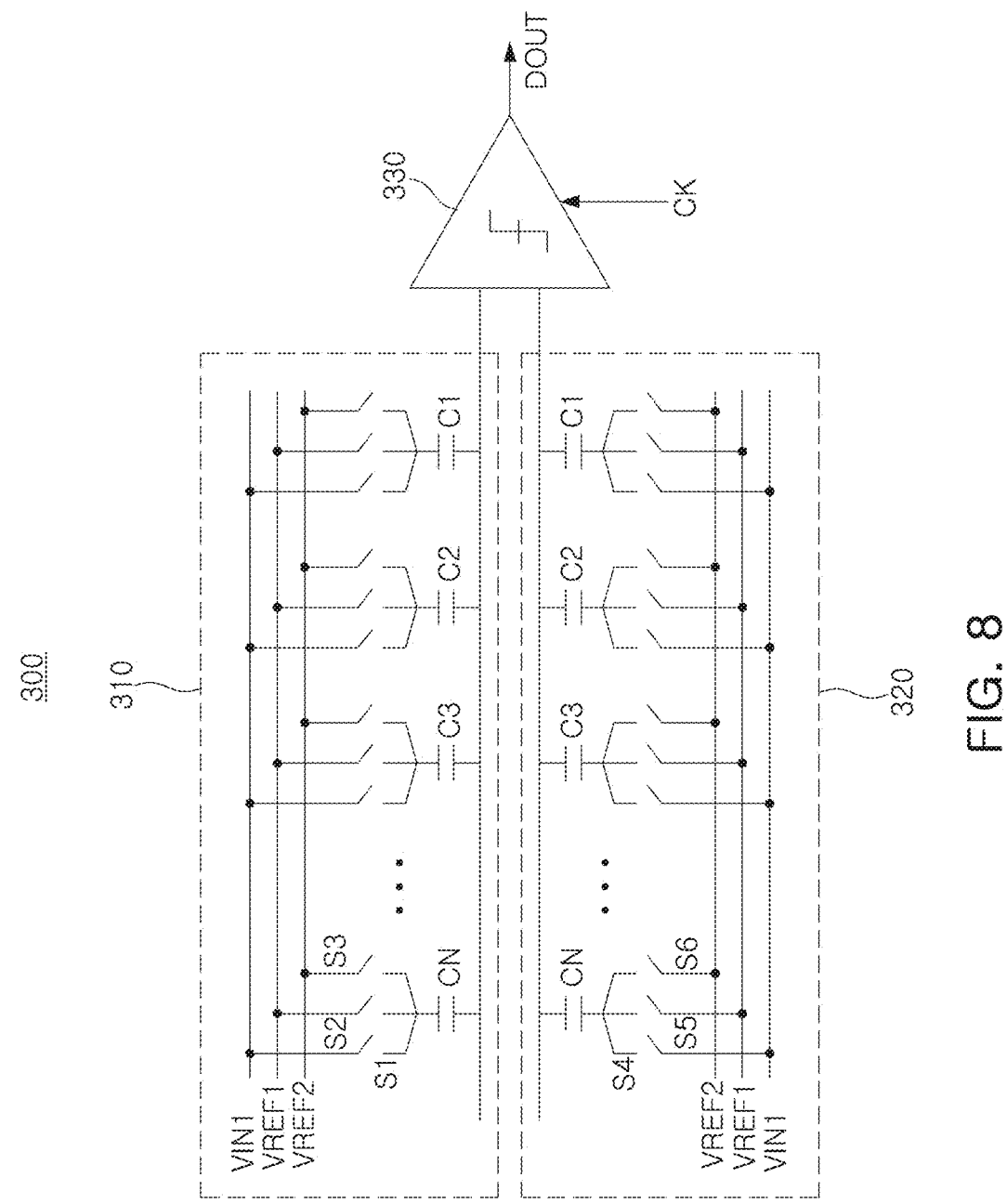
FIG. 8 is a schematic diagram illustrating an example of an analog-to-digital converter (ADC) included in a receiver in a semiconductor device.

FIG. 8 is a schematic diagram illustrating an example of an ADC included in a receiver in a semiconductor device.

Referring to FIG. 8, the ADC included in the receiver in the semiconductor device is a successive approximation ADC including CDACs 310 and 320 and a comparator 330. In FIG. 8, an analog signal, received by a receiver, may be a differential signal. A first input signal VIN1 and a second input signal VIN2, included in the differential signal, may be input to a first CDAC 310 and a second CDAC 320, respectively.

The first CDAC 310 may include a plurality of capacitors C1 to CN and a plurality of first to third switches S1 to S3. The first to third switches S1 to S3 may connect one of the capacitors C1 to CN to nodes supplying the first input signal VIN1, a first reference voltage VREF1, and a second reference voltage VREF2. For example, the first switch S1 may be connected between one of the capacitors C1 to CN and a node, transmitting the first input signal VIN1, the second switch S2 may be connected between one of the capacitors C1 to CN and a node, transmitting the first reference voltage VREF1, and the third switch S3 may be connected between one of the capacitors C1 to CN and a node, transmitting the second reference voltage VREF2.

The second CDAC 320 may have a structure similar to that of the first CDAC 310. The second CDAC 320 includes a plurality of capacitors C1 to CN and a plurality of fourth to sixth switches S4 to S6, and the fourth to sixth switches S4 to S6 may connect one of the capacitors C1 to CN to nodes supplying the second input signal VIN2, the first reference voltage VREF1, and the second reference voltage VREF2. Turn-on and turn-off of each of the first to sixth switches S1 to S6 may be controlled by a logic circuit, included in the semiconductor device, along with an ADC 300. In each of the first CDAC 310 and the second CDAC 320, at least some capacitors, among the capacitors C1 to CN, may have different capacitances.

A first input terminal of the comparator 330 may be connected to the first CDAC 310, and a second input terminal may be connected to the second CDAC 320. The comparator 330 may operate in synchronization with a clock signal CK, and may output a digital signal DOUT. For example, the clock signal CK may be provided from the clock generator 260 described above with reference to FIG. 7.

Each of the first CDAC 310 and the second CDAC 320 may operate using N-bit data provided by the logic circuit. For example, N-bit first data, provided by the logic circuit, may be input to the first CDAC 310, and N-bit second data, provided by the logic circuit, may be input to the second CDAC 320. For example, turn-on and turn-off of the first to third switches S1 to S3, connected to an N-th capacitor CN, may be determined by a most significant bit of the first data, and turn-on and turn-off of the first to third switches S1 to S3, connected to a first capacitor C1, may be determined by a least significant bit of the first data. The logic circuit may determine the first data and the second data by determining a most significant bit first and a least significant bit last in each of the first CDAC 310 and the second CDAC 320.

However, in some implementations, an operation of each of the first CDAC 310 and the second CDAC 320 may vary depending on an operating mode of the semiconductor device. For example, when the semiconductor device including the ADC 300 is in a first operating mode in which a multilevel signal or a relatively fast frequency signal is received, the first CDAC 310 and the second CDAC 320 may operate as a successive approximation ADC 300, along with the comparator 330. Conversely, when the receiver including the ADC 300 is in a second operating mode in which a relatively slow frequency signal is received or low power is consumed, the first CDAC 310 and the second CDAC 320 may operate as an offset cancellation circuit.

Figure 9:
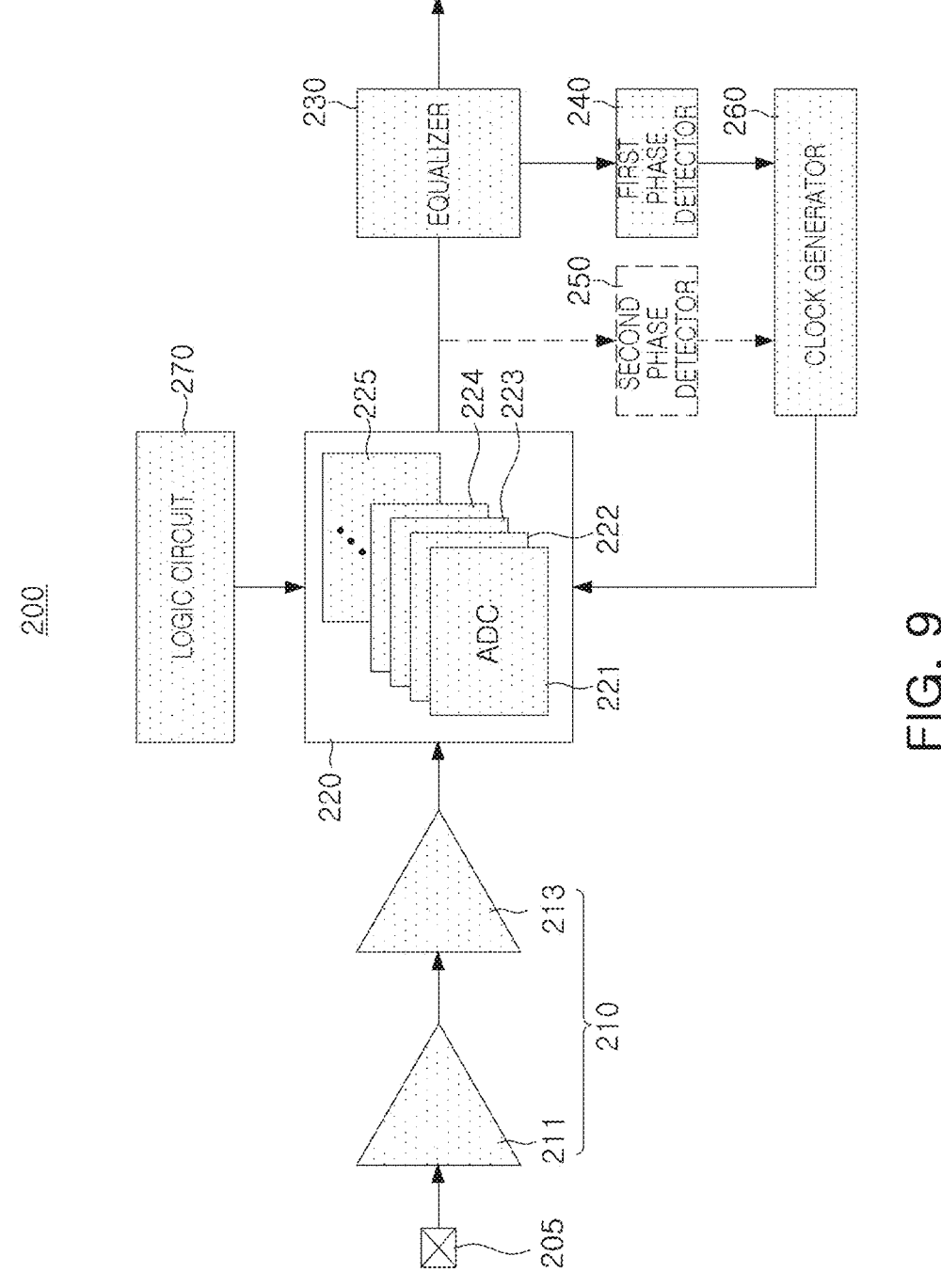
FIGS. 9 and 10 are diagrams illustrating an example of an operation of a semiconductor device.
Figure 10:
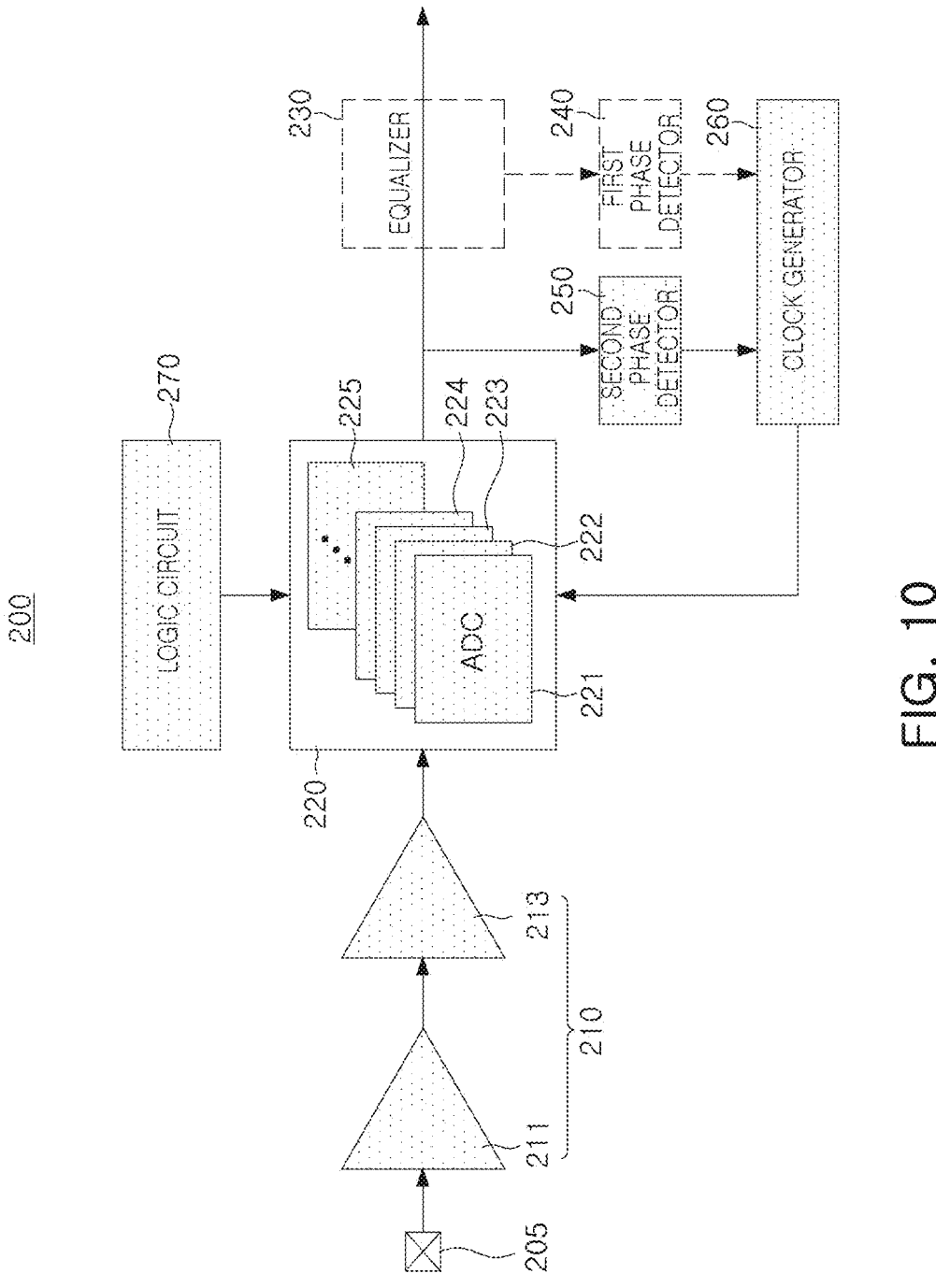

FIGS. 9 and 10 are diagrams illustrating an example of an operation of a semiconductor device.

First, FIG. 9 may be a diagram illustrating an operation of a receiver of the semiconductor device 200 in a first operating mode. Referring to FIG. 9, an analog signal, received by a pad 205 in the first operating mode, may be input to an ADC 220 via a first amplifier 211 and a second amplifier 213. In FIG. 9, all of a plurality of ADCs 221 to 225, included in the ADC 220, may be selected as first active ADCs 221 to 225.

Each of the first active ADCs 221 to 225 may operate as described above with reference to FIG. 8. The logic circuit 270 may input N-bit data to a CDAC of each of the first active ADCs 221 to 225, and may determine a most significant bit first and a least significant bit last in the N-bit data. A comparator included in each of the first active ADCs 221 to 225 may output a digital signal in synchronization with a clock output by the clock generator 260.

The equalizer 230 may process a digital signal output by each of the first active ADCs 221 to 225. For example, the equalizer 230 may compensate for inter-symbol interference (ISI) of a digital signal by assigning a predetermined weight to each of consecutive symbols and summing the assigned predetermined weights.

In the first operating mode, the first phase detector 240 may detect a phase error using an output of the equalizer 230. The first phase detector 240 may be an MMPD and, for example, may detect a phase error by comparing three consecutive values from a digital signal with a high reference voltage and a low reference voltage. The clock generator 260 may adjust phases of clock signals, respectively input to the first active ADCs 221 to 225, with reference to the phase error detected by the first phase detector 240.

FIG. 10 may be a diagram illustrating an operation of a receiver of the semiconductor device 200 in a second operating mode. Referring to FIG. 10, an analog signal, received by a pad 205 in the second operating mode, may be input to an ADC 220 via a first amplifier 211 and a second amplifier 213. In FIG. 10, first and second ADCs 221 and 222, among a plurality of ADCs 221 to 225 included in the ADC 220, may be selected as second active ADCs 221 and 222.

A CDAC included in each of the second active ADCs 221 and 222 may operate as an offset cancellation circuit rather than as a digital-to-analog converter. For example, a logic circuit 270 may compensate for an offset of a comparator, outputting a digital signal, using a capacitance of the CDAC included in each of the second active ADCs 221 and 222.

In the second operating mode, an equalizer 230 may be deactivated. Accordingly, the digital signal, output by the comparator in each of the second active ADCs 221 and 222, may be directly input to a digital processing circuit of a semiconductor device. In addition, in the second operating mode, a second phase detector 250, instead of a first phase detector 240, may detect a phase error of a digital signal, output by each of the second active ADCs 221 and 222, and may provide the phase error of the digital signal to a clock generator 260. The second phase detector 250 may be a BBPD, and thus a first ADC 221 may sample an analog signal and convert the analog signal into a digital signal, and a second ADC 222 may sample an edge of the analog signal.

Figure 11:
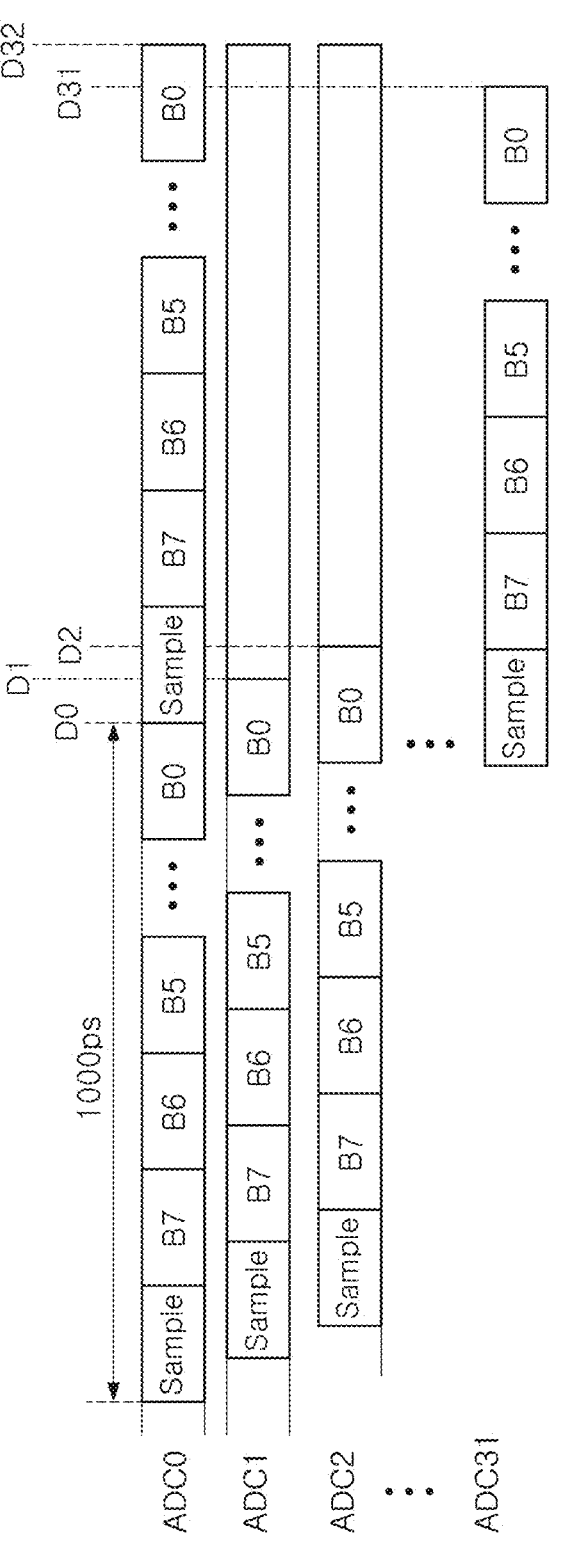
FIGS. 11 and 12 are diagrams illustrating an example of an operation of a semiconductor device.
Figure 12:
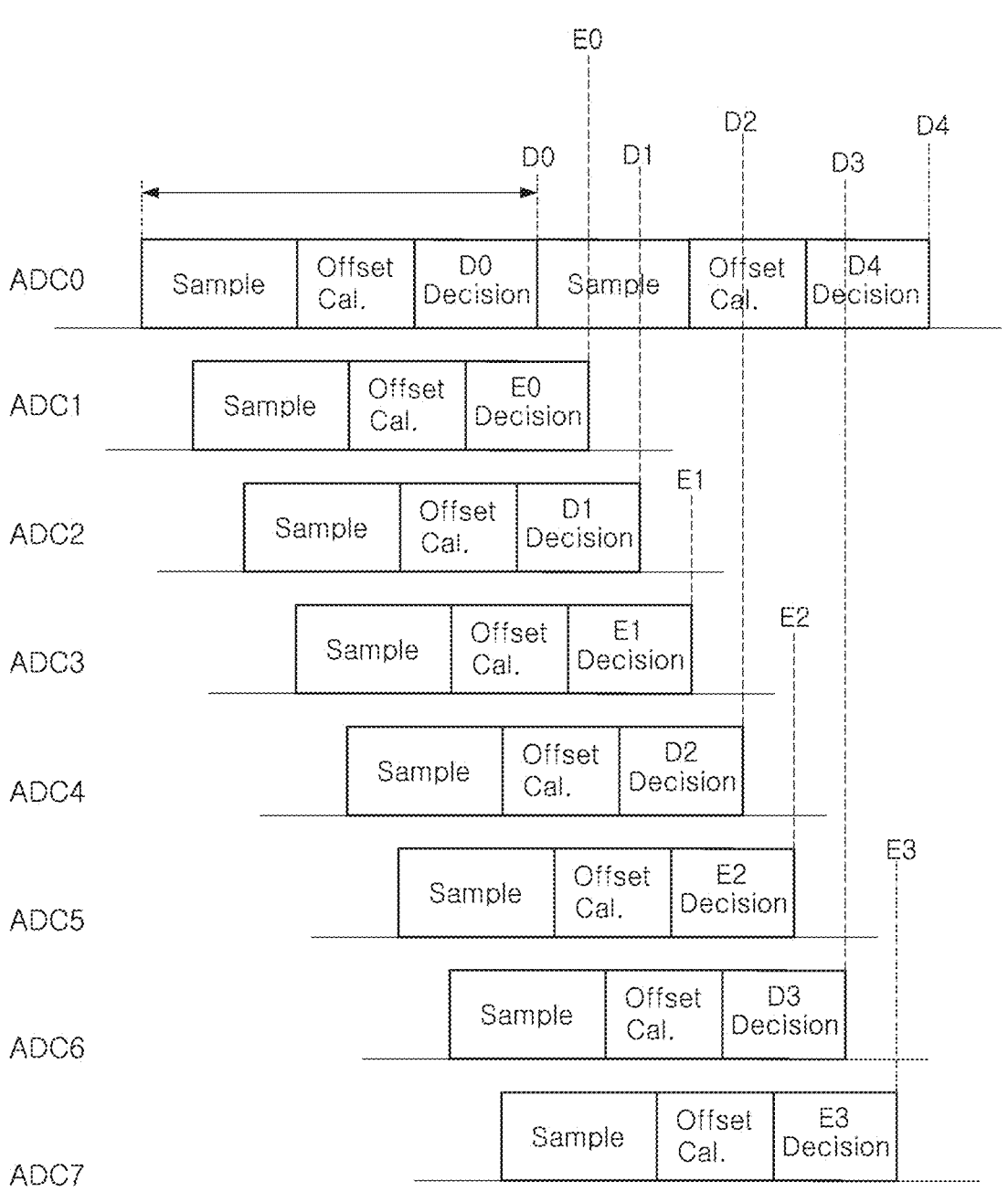

FIGS. 11 and 12 are diagrams illustrating an example of an operation of a semiconductor device.

First, FIG. 11 may be a diagram illustrating an operation of each of a first active ADCs in a first operating mode. In FIG. 11, 32 first active ADCs ADC0 to ADC31 may be activated to sequentially sample analog signals. In FIG. 11, each of the first active ADCs ADC0 to ADC31 may sample an analog signal and convert the analog signal into 8-bit data [B7:B0].

Referring to FIG. 11, a sampling period, required for each of the first active ADCs ADC0 to ADC31 to sample an analog signal once and convert the analog signal to 8-bit data [B7:B0], may be 1 ns. In FIG. 11, each of the first active ADCs ADC0 to ADC31 may operate at a sampling rate of 1 GS/sec.

As illustrated in FIG. 11, a receiver may output 32 digital signals D0 to D31 for 1 ns, and each of the digital signals D0 to D31 may have a resolution of 8 bits. Accordingly, the receiver may receive an analog signal of 32 Gbps in the first operating mode.

While operating in the first operating mode, the receiver may have a first latency. The first latency may be defined as a period of time required for each of the first active ADCs ADC0 to ADC31, receiving an analog signal, to output a digital signal, and may be 1 ns in FIG. 11.

FIG. 12 may be a diagram illustrating an operation of each of second active ADCs in a second operating mode. Referring to FIG. 12, eight second active ADCs ADC0 to ADC7 may be activated to sequentially sample analog signals. In FIG. 12, each of the second active ADCs ADC0 to ADC7 may sample an analog signal and convert the analog signal into 1-bit data.

In the second operating mode, some second active ADCs ADC0, ADC2, ADC4, and ADC6, among the second active ADCs ADC0 to ADC7, may sample data signals D0 to D4 from an analog signal. The remaining second active ADCs ADC1, ADC3, ADC5, and ADC7, among the second active ADCs ADC0 to ADC7, may sample an edge of the analog signal. This may be because an operation of a second phase detector, detecting a phase error using an output of the second active ADCs ADC0 to ADC7 in the second operating mode, requires a result of sampling the edge of the analog signal.

As described above, in the second operating mode, a CDAC included in each of the second active ADCs ADC0 to ADC7 may operate as an offset compensation circuit rather than a digital-to-analog converter. Thus, as illustrated in FIG. 12, an offset cancel operation may be performed, before the analog signal is sampled and then 1-bit data is determined.

While operating in the second operating mode, a receiver may have a second latency. In the same manner as the first latency, the second latency may be defined as a period of time required for each of the second active ADCs ADC0 to ADC7, receiving an analog signal, to output a digital signal, and may be 125 ps in FIG. 11. Accordingly, the first latency in the first operating mode may be relatively longer than the second latency in the second operating mode.

Figure 13:
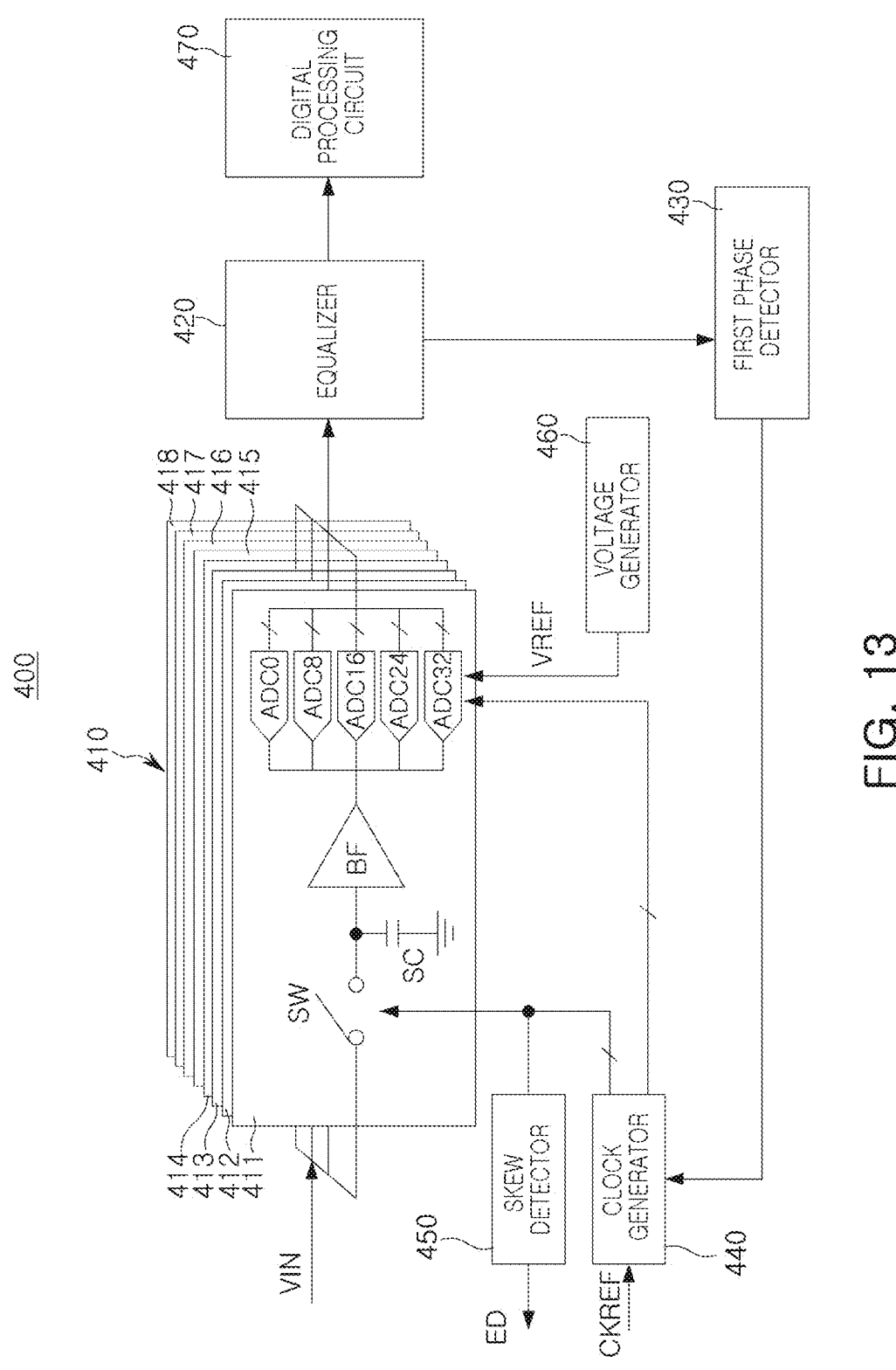
FIGS. 13 and 14 are diagrams illustrating an example of a first operating mode of a receiver included in a semiconductor device.
Figure 14:
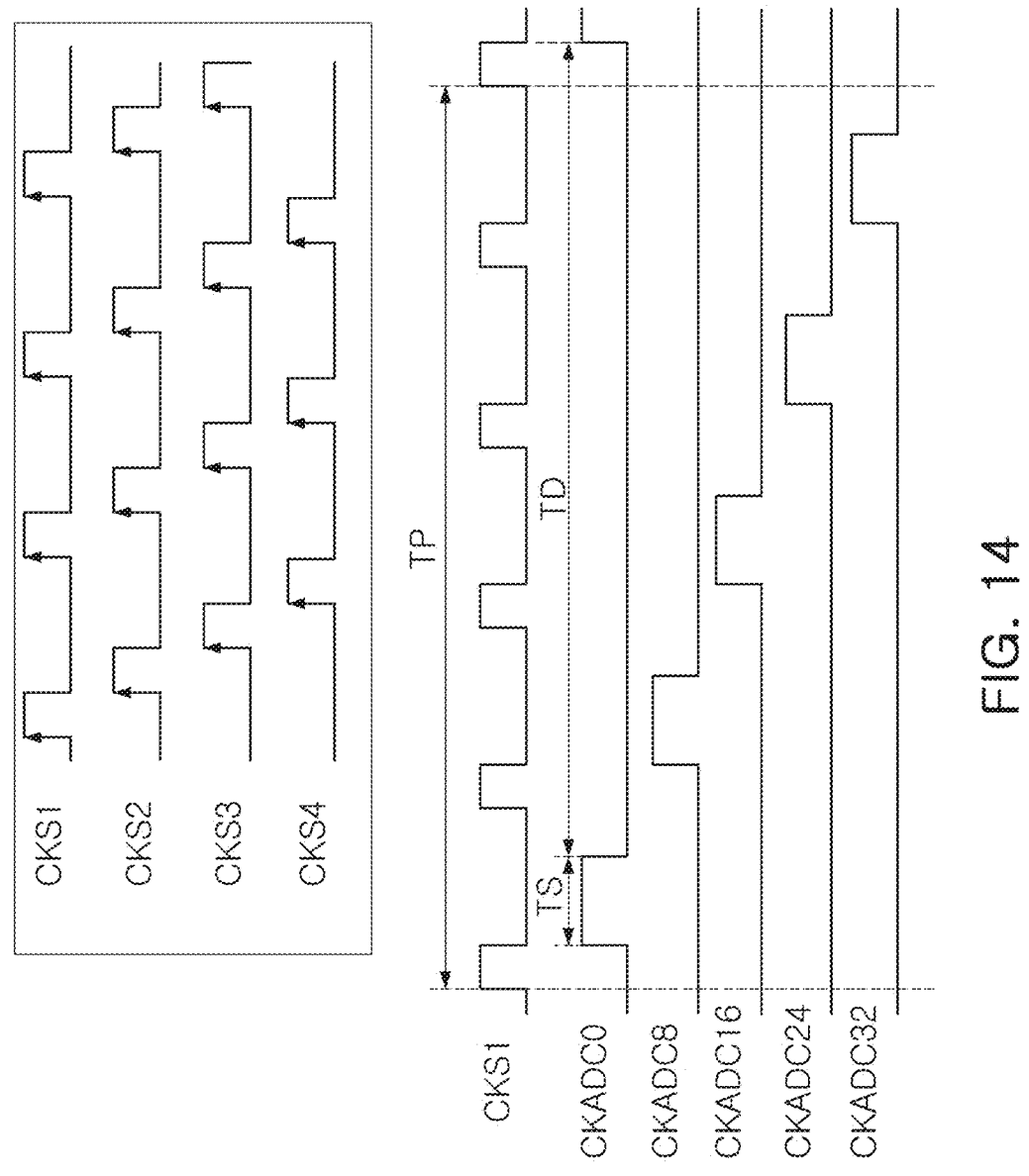

FIGS. 13 and 14 are diagrams illustrating an example of a first operating mode of a receiver included in a semiconductor device.

In FIGS. 13 and 14, an analog signal VIN, received by a semiconductor device 400 from another external device, may be input to a plurality of ADCs 411 to 418. Depending on an operating mode of the semiconductor device 400, at least some ADCs, among the plurality of ADCs 411 to 418, may be activated as active ADCs to output a digital signal, and the digital signal may be transmitted to a digital processing circuit 470.

Referring to FIG. 13, five ADC units may be included in each of the plurality of ADCs 411 to 418. For example, five ADC units ADC0, ADC8, ADC16, ADC24, and ADC32, included in a first ADC 411, may share one buffer BF, a sampling capacitor SC, and a switch element SW. However, an operation timing of each of the five ADC units ADC0, ADC8, ADC16, ADC24, and ADC32 may be controlled differently depending on clock signals output by a clock generator 440.

Each of the ADC units ADC0, ADC8, ADC16, ADC24, and ADC32 may include a CDAC and a comparator, as described above with reference to FIG. 8. The comparator may compare a reference voltage VREF, output by a voltage generator 460, with an output voltage of the CDAC, and a logic circuit may adjust N-bit data, input to the CDAC, on a bit basis with reference to an output of the comparator.

An operation timing of the comparator may be determined by clock signals output by the clock generator 440. In FIG. 13, first to fourth ADCs 411 to 414 may be selected as first active ADCs, and the clock generator 440 may output a plurality of clock signals having different phases, using a reference clock signal CKREF. In addition, the clock generator 440 may output switch clock signals controlling a switch element SW, using the reference clock signal CKREF.

For example, turn-on and turn-off of a switch element SW, included in the first ADC 411, may be controlled by a first switch clock signal, and an operation timing of each of the ADC units ADC0, ADC8, ADC16, ADC24, and ADC32, included in the first ADC 411, may be determined by first ADC clock signals. First to fourth switch clock signals, output by the clock generator 440, may be input to a skew detector 450, and the skew detector 450 may output error data ED detecting skews of the first to fourth switch clock signals. For example, the error data ED may be input to the digital processing circuit 470.

A digital signal, output by the first to fourth ADCs 411 to 414, may be transmitted to an equalizer 420, and the equalizer 420 may minimize inter-symbol interference of the digital signal to provide a digital processing circuit 470. The digital signal, output by the equalizer 420, may be input to a first phase detector 430, and the first phase detector 430 may detect a phase error of the digital signal and provide the phase error to the clock generator 440. Hereinafter, an operation of the semiconductor device 400 illustrated in FIG. 13 will be described in more detail with reference to FIG. 14.

Referring to FIG. 14, the clock generator 440 may generate first to fourth switch clock signals CKS1 to CKS4 having different phases, and the first to fourth switch clock signals CKS1 to CKS4 may have different phases. The switch element SW, included in the first ADC 411, may be turned on and off by the first switch clock signal CKS1. The ADC units ADC0, ADC8, ADC16, ADC24, and ADC32, included in the first ADC 411, may convert an analog signal into a digital signal in synchronization with a plurality of ADC clock signals CKADC0, CKADC8, CKADC16, CKADC24, and CKADC32. As illustrated in FIG. 14, a switching frequency of the switch element SW may be higher than an operating frequency of each of the ADC units ADC0, ADC8, ADC16, ADC24, and ADC32.

For example, the switch element SW may be turned on while the first switch clock signal CKS1 has a high logic value, and an analog signal may be stored in the sampling capacitor SC. Thereafter, one of the ADC units ADC0, ADC8, ADC16, ADC24, and ADC32 may sample the analog signal stored in the sampling capacitor SC, and may convert the sampled analog signal into N-bit digital data.

Referring to FIG. 14, when the switch element SW is first turned on by the first switch clock signal CKS1 and the analog signal is stored in the sampling capacitor SC, the first ADC unit ADC0 may perform a sampling operation and a digital conversion operation in response to the first ADC clock signal CKADC0. For example, the sampling operation may be performed during a sampling period TS, and the digital conversion operation may be performed during a digital conversion period TD.

Such an operation may be sequentially repeated by the five ADC units ADC0, ADC8, ADC16, ADC24, and ADC32, included in the first ADC 411. Accordingly, the analog signal may be sampled five times by the first ADC 411 during one period (TP) of the first switch clock signal CKS1. Similar operations may be simultaneously performed by the second to fourth ADCs 412 to 414 at different operation timings, such that an analog signal may be rapidly received and converted into a digital signal.

For example, assuming that the first switch clock signal CKS1 has a frequency of 3 GHz, each of the ADC clock signals CKADC0, CKADC8, CKADC16, CKADC24, and CKADC32, respectively input into the ADC units ADC0, ADC8, ADC16, ADC24, and ADC32, may have a frequency of 600 MHz. As a result, each of the 20 ADC units, included in the activated first to fourth ADCs 411 to 414, may operate at a sampling rate of 600 MS/sec., such that a sampling rate of the receiver may be 12 GS/sec.

Figure 15:
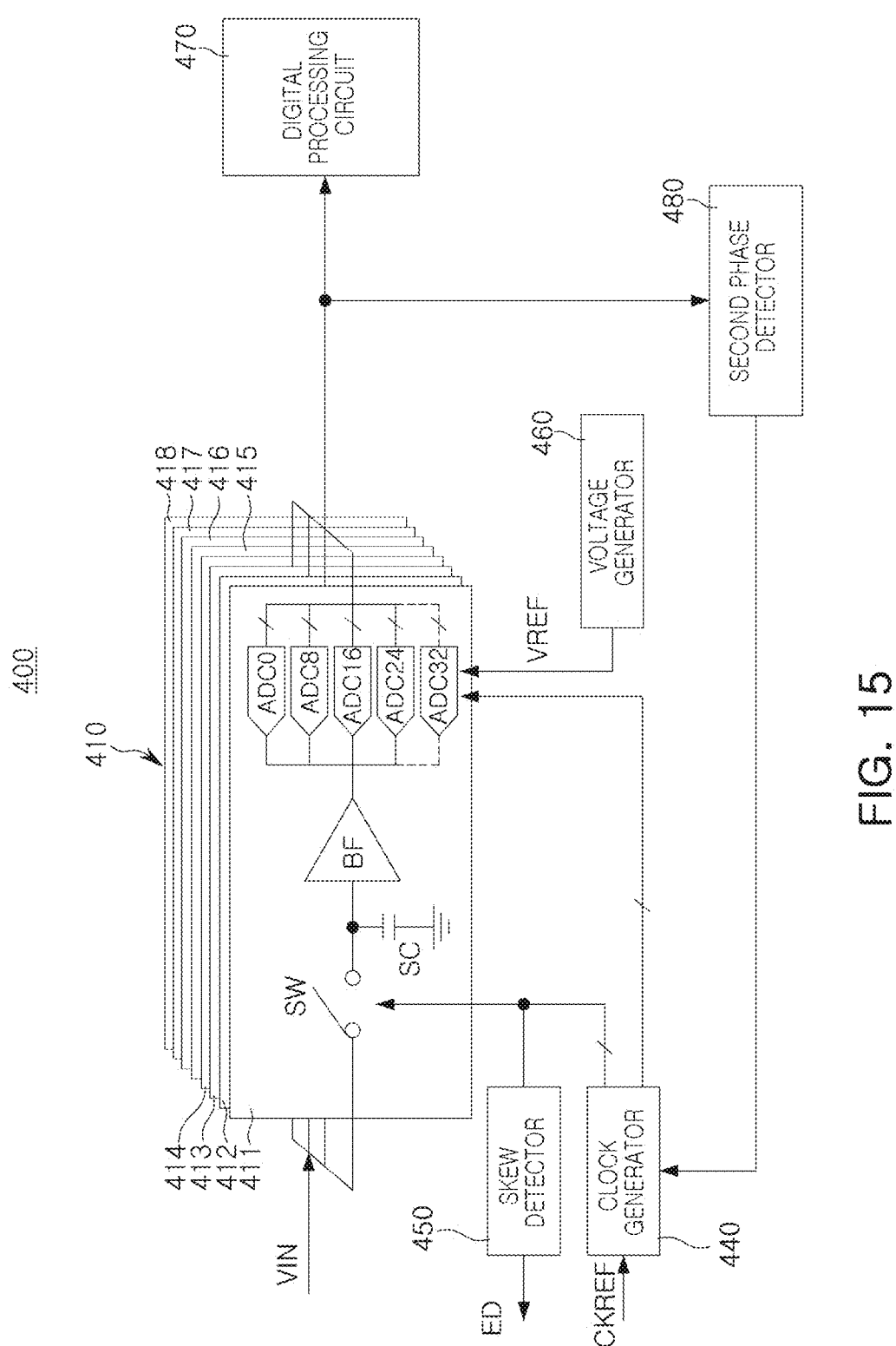
FIGS. 15 and 16 are diagrams illustrating an example of a second operating mode of a receiver included in a semiconductor device.
Figure 16:
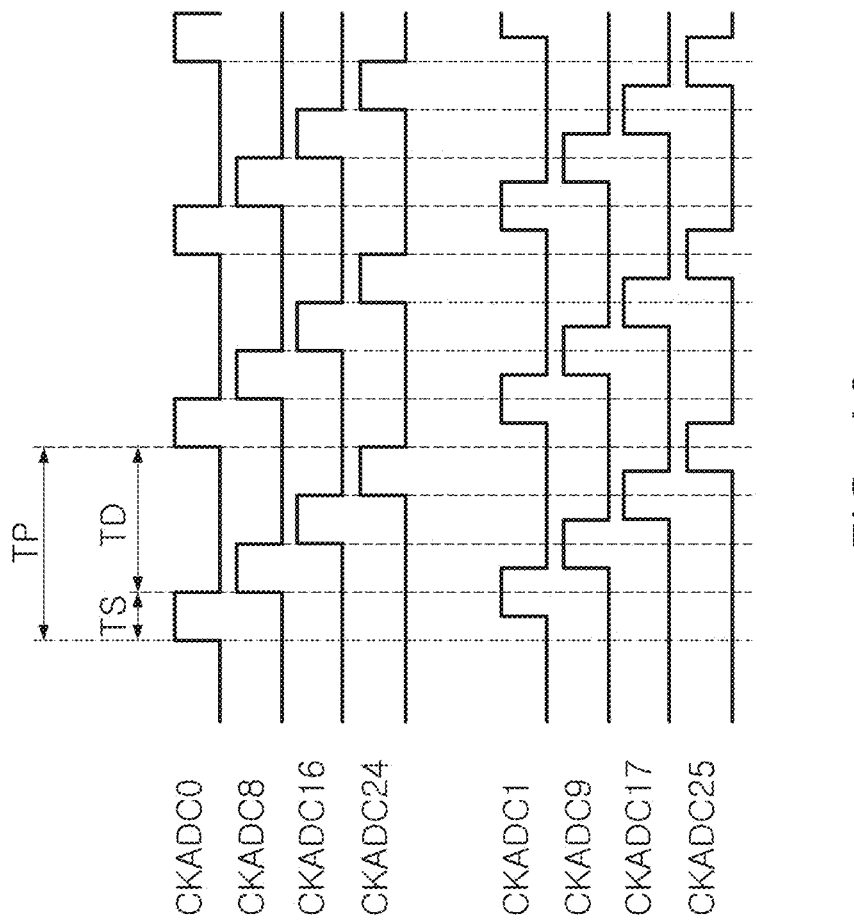

FIGS. 15 and 16 are diagrams illustrating an example of a second operating mode of a receiver included in a semiconductor device.

In FIGS. 15 and 16, an analog signal VIN, received by a semiconductor device 400 from another external device, may be input to a plurality of ADCs 411 to 418. Depending on an operating mode of the semiconductor device 400, at least some ADCs, among the plurality of ADCs 411 to 418, may be activated as active ADCs to output a digital signal, and the digital signal may be transmitted to a digital processing circuit 470.

The operating mode of the semiconductor device 400 described with reference to FIGS. 15 and 16 may be different from the operating mode described with reference to FIGS. 13 and 14. For example, the operating mode described with reference to FIGS. 15 and 16 may be a low-power mode having reduced power consumption, and only first and second ADCs 411 and 412, among the plurality of ADCs 411 to 418, may be activated.

As described above, each of the plurality of ADCs 411 to 418 may include five ADC units, sharing a switch element SW, a sampling capacitor SC, and a buffer BF. Using the first ADC 411 as an example, an operation timing of each of five ADC units ADC0, ADC8, ADC16, ADC24, and ADC32 may be controlled differently depending on a clock signal output by a clock generator 440.

In addition, in the second operating mode, only some ADC units, among ADC units, included in each of the plurality of ADCs 411 to 418 may actually operate. Referring to FIG. 15, in the second operating mode, four ADCs units ADC0, ADC8, ADC16, and ADC24, among the five ADC units ADC0, ADC8, ADC16, ADC24, and ADC32, included in the first ADC 411 may be activated. Accordingly, the number of ADC clock signals, output by the clock generator 440, may be less, as compared to the second operating mode described above with reference to FIGS. 13 and 14.

A CDAC, included in each of the ADC units ADC0, ADC8, ADC16, ADC24, and ADC32, may operate as an offset cancellation circuit rather than as a digital-to-analog converter. In addition, in each of the first and second ADCs 411 and 412, the switch element SW may be maintained in a turn-on state. Thus, as illustrated in FIG. 15, the clock generator 440 may not output a switch clock signal to the switch element SW.

Hereinafter, the operation of the semiconductor device 400 illustrated in FIG. 15 will be described in more detail with reference to FIG. 16.

Referring to FIG. 16, the clock generator 440 may generate a plurality of ADC clock signals CKADC0, CKADC1, CKADC8, CKADC9, CKADC16, CKADC17, CKADC24, and CKADC25 having different phases. In each of the first ADC 411 and the second ADC 412, the switch element SW may be maintained in the turn-on state, and a switch clock signal may not be generated.

First, the four ADC units ADC0, ADC8, ADC16, and ADC24, included in the first ADC 411, may sample an analog signal and convert the analog signal into a digital signal in synchronization with a plurality of ADC clock signals CKADC0, CKADC8, CKADC16, and CKADC24. Referring to FIG. 16, each of the ADC units ADC0, ADC8, ADC16, and ADC24 may sample an analog signal during a sampling period TS, and may convert the sampled analog signal into a digital signal during a digital conversion period TD. The digital signal, output by each of the ADC units ADC0, ADC8, ADC16, and ADC24, may include 1-bit data.

Four ADC units ADC1, ADC9, ADC17, and ADC25, included in the second ADC 412, may sample an edge of an analog signal. Referring to FIG. 16, a plurality of ADC clock signals CKADC1, CKADC9, CKADC17, and CKADC25, input to the second ADC 412, may have a phase different from that of a plurality of ADC clock signals CKADC0, CKADC8, CKADC16, and CKADC24, input to the first ADC 411. Thus, the edge of the analog signal may be detected by the second ADC 412, such that the second phase detector 480, operating as a BBPD, may detect a phase error.

In FIG. 16, one period (TP) of each of the plurality of ADC clock signals CKADC0, CKADC1, CKADC8, CKADC9, CKADC16, CKADC17, CKADC24 may be shorter than one period (TP) of each of the plurality of ADC clock signals CKADC0, CKADC8, CKADC16, and CKADC24 described above with reference to FIG. 14. In other words, a frequency of an ADC clock signal input to each of ADC units in the second operating mode may be higher than a frequency of an ADC clock signal input to each of ADC units in the first operating mode.

For example, in FIGS. 15 and 16, each of activated ADC units ADC0, ADC1, ADC8, ADC9, ADC16, ADC17, ADC24, and ADC25 may operate at a sampling rate of 3 GS/sec. The first ADC 411 may sample data from an analog signal, and the second ADC 412 may sample an edge of the analog signal, such that the receiver may operate at a sampling rate of 12 GS/sec.

As described above, a receiver of a semiconductor device may include a plurality of ADCs that may receive an analog signal in common. Output terminals of the plurality of ADCs may be connected to a digital processing circuit via an equalizer, but the equalizer may be deactivated depending on an operating mode. In addition, a first phase detector and a second phase detector, selectively operating depending on the operating mode, may be included in the receiver.

In a first operating mode that may be defined as a high-performance mode, first active ADCs, among a plurality of ADCs, may be activated, and a digital signal, output by each of the first active ADCs, may be input to the equalizer. In a second operating mode that may be defined as a low-power mode, second active ADCs, among the plurality of ADCs, may be activated. The number of the first active ADCs may be greater than the number of the second active ADCs. In addition, an operating frequency of each of the first active ADCs may be lower than an operating frequency of each of the second active ADCs.

In some implementations, in a first operating mode, first active ADCs may be activated, and each of the first active ADCs may output 2 bits or more of data after one sampling operation is performed. In a second operating mode, different from the first operating mode, second active ADCs, less than the first active ADCs in number, may be activated, and each of the second active ADCs may output 1-bit data after one sampling operation is performed. Thus, a receiver may have an improved sampling rate in the first operating mode and power consumption of the receiver may be lowered in the second operating mode, thereby optimally controlling the receiver in line with an operating environment.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While example implementations have been shown and described above, it will be apparent to those skilled in the art that modifications and variations could be made without departing from the scope of the present disclosure as defined by the appended claims.

What is claimed is:

1. A semiconductor device comprising:
an amplifier connected to a pad, the amplifier configured to receive an analog signal;
a plurality of analog-to-digital converters (ADCs) connected in parallel to an output terminal of the amplifier;
an equalizer connected to a plurality of output terminals of the plurality of ADCs;
a first phase detector connected to an output terminal of the equalizer;
a second phase detector connected to the plurality of output terminals of the plurality of ADCs; and
a clock generator configured to output a clock signal to each ADC of the plurality of ADCs with reference to an output of the first phase detector or an output of the second phase detector,
wherein the equalizer is configured to activate in a first operating mode, and deactivate in a second operating mode, the second operating mode being different from the first operating mode, and
wherein the clock generator is configured to:
output the clock signal with reference to the output of the first phase detector in the first operating mode, and
output the clock signal with reference to the output of the second phase detector in the second operating mode.

2. The semiconductor device of claim 1, wherein
a plurality of first active ADCs, among the plurality of ADCs, are configured to activate in the first operating mode, and a plurality of second active ADCs, among the plurality of ADCs, are configured to activate in the second operating mode, and
the number of the first active ADCs is greater than the number of the second active ADCs.

3. The semiconductor device of claim 2, wherein
in the first operating mode, each first active ADC of the plurality of first active ADCs is configured to output N-bit data per first sampling period, N being a natural number greater than 2, and

in the second operating mode, each second active ADC of the plurality of second active ADCs is configured to output 1-bit data per second sampling period.

4. The semiconductor device of claim 3, wherein the first sampling period is longer than the second sampling period.

5. The semiconductor device of claim 2, comprising:

a digital processing circuit configured to receive a plurality of outputs of the plurality of ADCs, wherein, in the first operating mode, an output of each first active ADC of the plurality of first active ADCs is transmitted to the digital processing circuit via the equalizer, and wherein, in the second operating mode, an output of each second active ADC of the plurality of second active ADCs passes the equalizer and is transmitted to the digital processing circuit.

6. The semiconductor device of claim 2, wherein some second active ADCs, among the plurality of second active ADCs, are configured to sample data transmitted via the analog signal, and the remaining second active ADCs, among the plurality of second active ADCs, are configured to sample an edge of the analog signal.

7. The semiconductor device of claim 6, wherein the number of the some second active ADCs is equal to the number of the remaining second active ADCs.

8. The semiconductor device of claim 1, wherein the clock generator is configured to:

output a plurality of first clock signals in the first operating mode, the plurality of first clock signals having a plurality of different phases, and output a plurality of second clock signals in the second operating mode, the plurality of second clock signals having a plurality of different phases, and wherein a frequency of each first clock signal of the plurality of first clock signals is lower than a frequency of each second clock signal of the plurality of second clock signals.

9. The semiconductor device of claim 1, wherein the first phase detector is a Mueller-Muller phase detector, and the second phase detector is a bang-bang phase detector.

10. The semiconductor device of claim 1, wherein the analog signal is a pulse amplitude modulation (PAM)-4 signal.

11. A semiconductor device comprising:

a plurality of analog-to-digital converters (ADCs) connected to each other in parallel, the plurality of ADCs configured to receive an analog signal;

a clock generator configured to provide a plurality of clock signals to the plurality of ADCs, respectively, the plurality of clock signals having a plurality of different phases; and a logic circuit configured to control the plurality of ADCs, wherein each ADC of the plurality of ADCs includes a capacitor digital-to-analog converter (CDAC) and a comparator, the CDAC including a plurality of capacitors and a plurality of switches, and the comparator configured to receive an output of the CDAC and to output digital data, wherein a first number of first active ADCs, among the plurality of ADCs, are configured to activate based on a first operating mode being selected, and a second number of second active ADCs, less than the first number of first active ADCs, are configured to activate based on a second operating mode, different from the first operating mode, being selected, and wherein the logic circuit is configured to control the CDAC and the comparator in each first active ADC of the first active ADCs to perform a successive approximation operation, and to perform an offset cancellation operation on the CDAC in each second active ADC of the second active ADCs.

12. The semiconductor device of claim 11, wherein the analog signal includes a first analog signal and a second analog signal, the first analog signal and the second analog signal having phases opposite to each other, and each ADC of the plurality of ADCs includes a first CDAC and a second CDAC, the first CDAC configured to receive the first analog signal and at least one reference voltage, and the second CDAC configured to receive the second analog signal and the at least one reference voltage.

13. The semiconductor device of claim 11, wherein the analog signal is a multilevel signal in the first operating mode, and the analog signal is a non-return to zero (NRZ) signal in the second operating mode.

14. The semiconductor device of claim 11, wherein an operating frequency of each first active ADC of the first active ADCs is lower than an operating frequency of each second active ADC of the second active ADCs.

15. The semiconductor device of claim 11, wherein two or more ADCs, among the plurality of ADCs, are configured to share a switch element and a sampling capacitor.

16. The semiconductor device of claim 15, wherein in the first operating mode, the switch element are repeatedly turned-on and turned-off by a switch clock signal at a predetermined switching frequency, and in the second operating mode, the switch element is maintained in a turn-on state.

17. The semiconductor device of claim 16, wherein the predetermined switching frequency is higher than an operating frequency of each first active ADC of the first active ADCs.

18. A semiconductor device comprising:

a plurality of analog-to-digital converters (ADCs) configured to receive an analog signal from at least one amplifier, the at least one amplifier being connected to a pad; and a logic circuit configured to control the plurality of ADCs, wherein the logic circuit is configured to activate a plurality of first active ADCs, among the plurality of ADCs, in a first operating mode, and to activate a plurality of second active ADCs, among the plurality of ADCs, in a second operating mode, the second operating mode being different from the first operating mode, and wherein a first latency for the first plurality of active ADCs to receive the analog signal and to output a first digital signal is longer than a second latency for the plurality of second active ADCs to receive the analog signal and to output a second digital signal.

19. The semiconductor device of claim 18, comprising:

a clock generator configured to a plurality of output clock signals to the plurality of ADCs, the plurality of output clock signals having a plurality of different phases, wherein a frequency of each first clock signal of a plurality of first clock signals, input to the plurality of first active ADCs in the first operating mode, is lower than a frequency of each second clock signal of a plurality of second clock signals, input to the plurality of second active ADCs in the second operating mode.

20. The semiconductor device of claim 18, wherein the number of the plurality of first active ADCs is greater than the number of the plurality of second active ADCs.

* * * * *